United States Patent [19]

Schechtman et al.

[11] Patent Number: 4,598,215
[45] Date of Patent: Jul. 1, 1986

[54] WIDE COMMON MODE RANGE ANALOG CMOS VOLTAGE COMPARATOR

[75] Inventors: Melvin A. Schechtman, Schaumburg; Ronald H. Cieslak, Chicago, both of Ill.

[73] Assignee: Motorola, Inc., Schaumburg, Ill.

[21] Appl. No.: 548,537

[22] Filed: Nov. 3, 1983

[51] Int. Cl.$^4$ ............................................. H03K 5/24
[52] U.S. Cl. ................................. 307/355; 307/491; 307/494; 307/362
[58] Field of Search ............. 307/491, 494, 496, 497, 307/350, 530, 362, 355, 356; 330/258

[56] References Cited

U.S. PATENT DOCUMENTS

| | | |
|---|---|---|
| 3,863,171 | 1/1975 | Kawashima . |
| 3,876,887 | 4/1975 | Reed ...................... 307/350 |
| 3,943,380 | 3/1976 | Morgan et al. . |
| 4,110,641 | 8/1978 | Payne .................... 307/355 |
| 4,247,789 | 1/1981 | Cate et al. . |
| 4,264,873 | 4/1981 | Kominami et al. . |
| 4,371,843 | 2/1983 | Fang et al. . |

OTHER PUBLICATIONS

"C-MOS Filter Cuts Part Count", *Electronics*, Mar. 10, 1983, p. 180.

*Primary Examiner*—John Zazworsky
*Attorney, Agent, or Firm*—James E. Jacobson, Jr.; Edward M. Roney; Donald B. Southard

[57] ABSTRACT

An improved analog CMOS comparator circuit is described. The improved circuit incorporates an additional CMOS device in the output stage of a conventional differential comparator. The additional device compensates for current imbalances which occur at relatively high common mode voltages thus allowing the improved comparator to operate over a wider range of common mode input voltages.

2 Claims, 2 Drawing Figures

WIDE COMMON MODE RANGE ANALOG CMOS VOLTAGE COMPARATOR

BACKGROUND OF THE INVENTION

This invention relates to the field of integrated circuits and specifically to a comparator circuit which exhibits improved low power supply operating voltage characteristics.

Many types of comparator circuits are well known in the art. Typical comparator circuits are usually configured as a differential amplifier which is sensitive to a difference in voltage between each of the respective inputs to the amplifier. The input and output stages of the conventional comparator circuit are typically coupled to devices which provide a constant current to a common node of the differential input transistors, as well as an independent constant current to the output stage of the comparator. The output nodes of the differential pair of transistors are typically coupled to a current mirror circuit. The output stage, consisting of several devices connected in series is usually coupled to the output of one of the differential input transistors.

Since comparators of this type consist of multiple transistors disposed in tandem, the low voltage operation of comparator circuits is limited by imbalances which occur between the input stage devices and the output stage devices.

SUMMARY OF THE INVENTION

Accordingly, it is an object of the present invention to provide an integratable comparator circuit with improved low voltage operating characteristics.

It is another object of the present invention to provide an improved comparator circuit which is resistant to current imbalances due to extreme common mode input voltages.

It is still another object of the present invention of the foregoing type to provide a comparator circuit which is easily fabricated on an integrated circuit.

It is yet another object of the present invention to provide a comparator circuit which exhibits improved input offset voltage characteristics.

Briefly described, the invention contemplates placing an additional buffer transistor in the output stage of a differential comparator. The new device is disposed between the current source and the output load transistors. The gate input of the compensating device is connected in common with the gate input of the inverting differential input device. The compensating device acts to correct current imbalances in the current source transistors due to variations in the common mode input signals which approach the input power supply voltage.

DETAILED DESCRIPTION OF THE DRAWINGS

Figure 1:
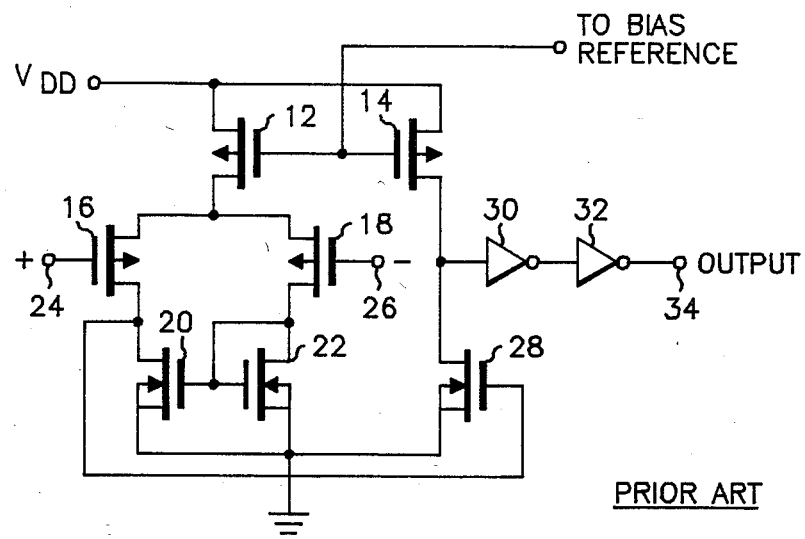
FIG. 1 is a schematic drawing of a prior art CMOS differential comparator circuit.

FIG. 1 shows a prior art CMOS differential comparator circuit. The comparator circuit 10 consists of a differential pair of p-channel CMOS Devices 16, 18 which are configured so that their respective source terminals are connected together. This common connection is further connected to the drain terminal of a p-channel current source device 12. The prior art comparator actually utilizes two p-channel current source transistors 12 and 14 wherein the respective source and gate terminals of each device are coupled together. The common source terminals of devices 12 and 14 are coupled to an input power supply and the common gate terminals are coupled to a bias reference source. As devices 12, 14 are coupled to a common bias reference, they produce substantially identical currents. The operation of the current source devices will be discussed in more detail later.

The prior art comparator circuit further includes two additional n-channel current sink devices 20, 22 which comprise the differential input stage. These devices are disposed in a current mirror configuration whose properties are well known. The n-channel current mirror devices 20, 22 are configured with common gate terminals, as well as common source terminals. The common source terminals of devices 20, 22 are coupled to ground or some voltage which is more negative than the input power supply voltage. The drain terminal of device 20 is coupled to the drain terminal of device 16. Likewise, the drain of current mirror device 22 is coupled to the drain terminal of input device 18. The gate and drain terminals of device 22 are coupled together.

As can be seen in FIG. 1, if an identical voltage appears at terminals 24 and 26 of the comparator circuit 10, then identical currents will flow into the drain terminals of devices 20, 22. Within certain limits, the identical voltage at terminals 24, 26 can rise and fall and still produce substantially identical currents at the drain terminals of devices 16 and 18. An identical voltage which appears at terminals 24 and 26 is referred to as the common mode input voltage. Differential amplifiers and comparators of this type exhibit a common mode effect because the input devices share a common current source input. As long as the input devices 16, 18 operates with identical input voltages, the source terminal voltages will track the device input voltage, and the input current will divide equally between the devices. The current source of the comparator circuit is formed by a p-channel device 12 of FIG. 1 which comprises a transistor biased by a bias reference source. A similar p-channel current source 14 provides current to the output stage 28 and is typically biased to the same reference as device 12.

As mentioned earlier, the p-channel input devices 16, 18 are coupled to a current mirror configuration which is well known. Specifically, the drain terminal of input device 16 is coupled to a drain terminal of a current sink device 20. In a similar fashion, the drain terminal of input device 18 is coupled to a current sink device 22. The gate terminals of current sink devices 20, 22 are coupled together and the drain terminal of device 22 is coupled to the common gate terminal of devices 20 and 22. The gate terminal of a n-channel output device 28 is coupled to the common terminal of input device 16 and current sink device 20. The source terminals of output device 28 and current sink devices 20 and 22 are coupled to a common terminal which may be connected to ground. The drain terminal of output device 28 is coupled to the drain terminal of current source device 14. The common terminal of current source 14 and output device 28 forms the output terminal of the comparator circuit and can be used to drive additional buffer devices 30 and 32.

The operation of the differential comparator circuit can be explained in the following manner. Within certain limits a constant voltage appearing at terminal 26 will cause a fixed current to flow through devices 18 and 22. Since current sink devices 20 and 22 share a common bias point referenced to the output current of input device 18, the available current sink capabilities of device 20 will be limited by the output current of input device 18. If a positive differential voltage, above a predetermined threshold, appears at terminal 24, the drain terminal of device 16 will produce an output current which exceeds the current sink capabilities of current sink 20. Any excess voltage will subsequently activate the gate terminal of output device 28 causing it to sink the current produced by current source 14, thereby switching the output buffer devices 30 and 32. In a similar manner, a changing voltage appearing at terminal 26 will cause the comparator threshold voltage to shift accordingly.

The circuit will operate over a wide range of common mode voltages. In practice, however, the prior art comparator circuit fails to perform properly for common mode voltages near the input power supply voltage. The performance at low common mode voltage is affected by factors such as device thresholds and physical device geometries. The performance at high common mode voltage, however, while limited by device parameters, is also affected by an imbalance in the currents supplied by current source devices 12, 14 that is caused by the high common mode input.

If a constant differential voltage is applied to terminals 24 and 26, respectively, and the common mode input voltage is varied, as the common mode input voltage approaches a certain limit, the output device incorrectly switches from one state to another even though the differential voltage is unchanged. The reason for improper switching is that output device 28 cannot properly sink the current generated by current source 14. This effect results because current sources 12 and 14 operate independently. Current source 12 establishes the bias current level for the differential pair 16 and 18. This current flows through the current mirror sink devices 20 and 22. The voltage which appears at the drain terminals of devices 20 and 22 is related to the value of this bias current.

With a small differential input voltage applied (−1 mv), input device 16 conducts more current than input device 18. An amplified version of this differential signal appears as the difference voltage at the drain terminals of devices 20 and 22.

At high common mode inputs, the bias current produced by current source device 12 begins to fall off because the current source is forced out of saturation. The falling bias current causes the voltage appearing across the current sink devices 20 and 22 to diminish, allowing the voltage appearing at the drain terminals of the current sink devices to fall. As the voltage at the drain terminal of current sink device 20 falls, the drive voltage supplied to output device 28 becomes insufficient to pull down the current supplied by the current source 14. Consequently, the output inverter 30 switches causing an incorrect output signal.

Figure 2:
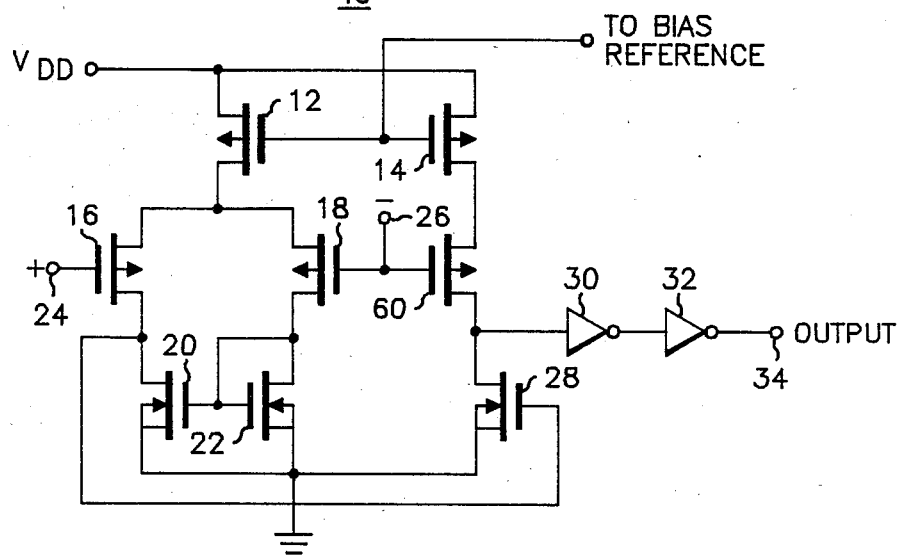
FIG. 2 is a schematic drawing of the improved CMOS differential comparator circuit which demonstrates the practice of the preferred embodiment.

Referring now to FIG. 2, there is shown the improved differential comparator circuit constructed in accordance with the preferred practice of the present invention. The preferred embodiment of the present invention comtemplates placing an additional p-channel buffer transistor 60 in tandem with the output stage of the comparator circuit of FIG. 1. Specifically, the drain terminal of current source 14 is coupled to the source terminal of the new output buffer device 60. The drain terminal of the new output buffer device 60 is coupled to the drain terminal of output device 28 as well as the input terminal of inverter 30. The gate terminal of output device 60 is connected in common with the gate terminal of input device 18 to form an inverting input terminal to the improved comparator 40.

The improved comparator configuration solves the abovementioned common-mode voltage problem of the conventional comparator circuit. In operation, the gate-to-source voltage drop across the new device 60 causes the current source 14 drain voltage to track the common mode input voltage, forcing the current source 14 out of saturation and thereby causing its bias current output to fall off, following a similar fall off in current produced by current source 12. With a reduced current produced by current source 14, the output device 28 is capable of sinking the current produced by current source 14 and retain a correct output level even though input device 16 is providing a reduced drive voltage to output device 28.

The improved comparator structure exhibits an additional feature of reducing the variation of input offset voltage with changes in common mode voltage, by improving the tracking of the current source transistors 12 and 14. The new device 60 stabilizes the operating voltage at the drain terminal of output device 28 thereby reducing the offset voltage it contributes. This effect occurs in the following manner. The improved differential comparator circuit is fabricated such that input devices 16, 18, and current sink devices 20, 22 are substantially identical or matched. As mentioned earlier, an identical voltage appearing at terminals 24 and 26 will cause equal currents to flow through input devices 16, 18. The geometries of current sources 12 and 14 are proportioned such that current source 14 produces a current which is a predetermined multiple of the current produced by current source 12. Similarly, the new output device 60 is proportioned to devices 16, 18 by the same factor as the respective dimensions of current sources 14 and 12. This causes the new output device 60 to exhibit the same voltage drop across the device as the input devices 16 and 18. The output device 28 is proportioned according to the same ratio with respect to the current sink devices 20, 22. Therefore, output device 28 has the same voltage drop as current sink devices 20, 22, even though a proportionately higher current flows through it. More importantly, at balance, the voltage appearing at the drain terminals of devices 20, 22 and 28 are equal. This effect occurs because the chain comprising devices 14, 60 and 28 is ratioed to the chain comprising device 12, and devices 16 and 20 or devices 18 and 22.

The preferred embodiment of the present invention was configured to be compatible with any conventional analog CMOS process. However, the disclosed invention will perform satisfactorily with many analog integrated circuit processes, such as a bipolar semiconductor process.

In summary, an improved differential comparator circuit has been described. The present invention contemplates placing an additional buffer device in series with the output stage of a conventional comparator and coupling the input terminal of the new device to the inverting input of the differential input devices. The improved comparator circuit exhibits improved common-mode input voltage characteristics as well as exhibiting a stability not found in convention comparator circuits. Accordingly other uses and modifications will be obvious to one skilled in the art without departing from the spirit and scope of the present invention.

What is claimed is:

1. An improved differential comparator circuit comprising:
   (a) first and second current source means having outputs providing constant sources of current, respectively;
   (b) differential input means comprising a first and second differential transistor means having common terminal, said common terminal being coupled to the output of said first current source means, said first and second differential transistor means each having input and output terminals.
   (c) current mirror means comprising a first and second current mirror transistor means, each having an input, said first and second mirror transistor means coupled to said output terminals of said first and second differential transistor means, respectively;
   (d) output transistor means having an output terminal and further having an input terminal coupled to the output terminal of said first differential transistor means and the input terminal of said first current mirror transistor means; and
   (e) output buffer transistor means coupled between the output of said second current source means and the output terminal of said output transistor means and having an input terminal coupled to the input terminal of said second differential input transistor means.

2. The apparatus as recited in claim 1 further including output driver means having an input coupled to the output terminal of said output transistor means, and having an output comprising the output of said improved differential comparator circuit.

* * * * *